US008683413B2

(12) United States Patent　　(10) Patent No.: US 8,683,413 B2
Becker et al.　　(45) Date of Patent: Mar. 25, 2014

(54) METHOD FOR MAKING HIGH-SPEED CERAMIC MODULES WITH HYBRID REFERENCING SCHEME FOR IMPROVED PERFORMANCE AND REDUCED COST

(75) Inventors: Wiren Dale Becker, Hyde Park, NY (US); Jinwoo Choi, Austin, TX (US); Tingdong Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/621,242

(22) Filed: Sep. 15, 2012

(65) Prior Publication Data

US 2013/0252379 A1　　Sep. 26, 2013

Related U.S. Application Data

(63) Continuation of application No. 12/630,993, filed on Dec. 4, 2009, now Pat. No. 8,339,803.

(51) Int. Cl.
*G06F 17/50* (2006.01)
*G06F 9/455* (2006.01)
*H01L 21/00* (2006.01)

(52) U.S. Cl.
USPC ............................ 716/120; 716/133; 438/121

(58) Field of Classification Search
USPC .................................. 716/120, 133; 438/121
See application file for complete search history.

(56) References Cited

U.S. PATENT DOCUMENTS

2008/0230259 A1 * 9/2008 Booth Jr. et al. ............... 174/254

OTHER PUBLICATIONS

U.S. Appl. No. 12/630,993 entitled "High-Speed Ceramic Modules With Hybrid Referencing Scheme for Improved Performance and Reduced Cost"; Notice of Allowance dated Aug. 14, 2012 (12 pg.).
U.S. Appl. No. 12/630,993 entitled "High-Speed Ceramic Modules With Hybrid Referencing Scheme for Improved Performance and Reduced Cost"; Non-final office action dated Mar. 16, 2012. (19 pg.).

* cited by examiner

*Primary Examiner* — Suresh Memula
(74) *Attorney, Agent, or Firm* — Yudell Isidore Ng Russell PLLC

(57) ABSTRACT

A multi-layered ceramic package comprises: a signal layer with identified chip/device area(s) that require a supply of power; and a voltage power (Vdd) layer and a ground (Gnd) layer disposed on opposite sides directly above or below and adjacent to the signal layer and providing a first reference mesh plane and a second reference mesh plane configured utilizing a hybrid mesh scheme. The hybrid mesh scheme comprises: a full dense mesh in a first area directly above or below the identified chip/device area(s); a half dense mesh in a second area that is above or below the edge(s) of the chip/device area; and a wider mesh pitch in all other areas The Vdd traces are aligned to run parallel and adjacent to signal lines in those other areas. Wider traces are provided within the mesh areas that run parallel and adjacent to signal lines.

15 Claims, 7 Drawing Sheets

METHOD FOR MAKING HIGH-SPEED CERAMIC MODULES WITH HYBRID REFERENCING SCHEME FOR IMPROVED PERFORMANCE AND REDUCED COST

PRIORITY CLAIM

The present application is a divisional of and claims priority from U.S. patent application Ser. No. 12/630,993, filed on Dec. 4, 2009, titled "High-Speed Ceramic Modules with Hybrid Referencing Scheme for Improved Performance and Reduced Cost," which is incorporated by reference herein in its entirety and for all purposes.

BACKGROUND

1. Technical Field

The present invention generally relates to integrated circuit packaging and in particular to an improved ceramic package. Still more particularly, the present invention relates methods for designing and fabricating ceramic packages with hybrid mesh layers for improved performance.

2. Description of the Related Art

Ceramic packages, such as glass ceramic (GC) or 9211 modules, are becoming a popular option for fabrication of integrated circuit (IC) modules. With these ceramic packages/modules, the metal layers comprise of mesh planes instead of solid metal planes. Typically, the signal layer(s) in which high speed signals propagate have mesh planes located above and below the signal layer in order to provide path(s) for high frequency return current. The mesh plane design includes discontinuities within the mesh planes. These discontinuities make the high frequency signal return path worse, leading to higher near end (NE) and far end (FE) crosstalk coefficients (which are defined by crosstalk amplitude per unit length of a signal line).

One of manufacturing limitations of these kinds of ceramic module (i.e., those designed with mesh planes) is that the metal loading (i.e., the amount of metal area versus total area of a layer) is limited. For example, with GC modules, the ratio of metal area to total area is capped at about 30%, while with 9211 modules, that ratio is capped at about 40%. There are specific limitations, including yield issues, which are manifest when/if the metal loading in the ceramic module is higher than these respective ratios. Additionally, the metal loading ratios also indicates how much copper (Cu) paste is required for manufacturing the ceramic modules, and the amount of Cu directly affects the manufacturing cost for the ceramic modules.

BRIEF SUMMARY

Disclosed is method for making a multi-layered ceramic package, where the package comprises: a signal layer with high power usage (HPU) areas and one or more non-HPU areas; a voltage power (Vdd) layer disposed on a first side and a ground (Gnd) layer disposed on the opposite side, both directly adjacent to the signal layer and providing a first reference mesh plane and a second reference mesh plane that are configured according to a hybrid mesh scheme. The hybrid mesh scheme comprises two or more mesh densities within the single Vdd layer and Gnd layer from among: a full dense mesh in a first area of the Vdd layer and Gnd layer that is directly adjacent to the one or more HPU area in the signal layer; a half dense mesh in a second area of the Vdd layer and Gnd layer that is adjacent to one or more perimeter edges of and proximate to the HPU area in the signal layer; and a low density mesh in all other areas of the Vdd layer and Gnd layer that are not adjacent or proximate to the HPU area within the signal layer. The low density mesh provides a wider mesh pitch in the other areas, and the Vdd traces and Gnd are aligned to run parallel to adjacent signal lines in those other areas. Wider Vdd and Gnd traces are provided within the mesh scheme for traces that run parallel to the adjacent signal lines in the non HPU areas.

The above as well as additional objectives, features, and advantages of the present invention will become apparent in the following detailed written description.

BRIEF DESCRIPTION OF THE SEVERAL VIEWS OF THE DRAWINGS

The invention itself, as well as advantages thereof, will best be understood by reference to the following detailed description of illustrative embodiments when read in conjunction with the accompanying drawings, wherein.

DETAILED DESCRIPTION

Figure 1:
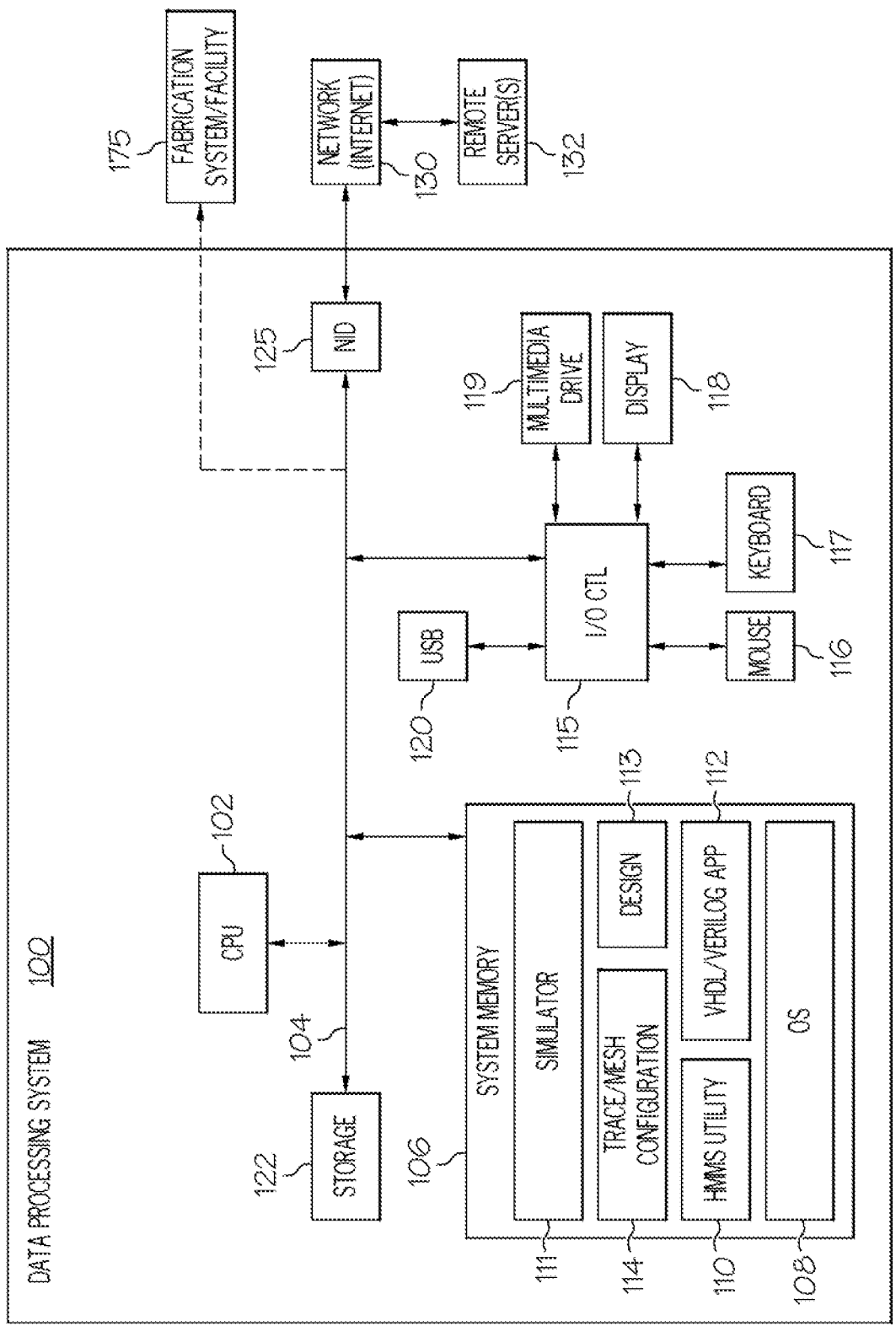
FIG. 1 provides a block diagram representation of an example data processing system within which features of one embodiment may be implemented.

As described herein, the embodiments provide a multi-layered ceramic package, as well as a method, a fabrication system/device and a computer program product for providing a hybrid mesh scheme within the reference Vdd and Gnd mesh layers to enable good power delivery to chips/devices within the signal layer sandwiched between the Vdd and Gnd layers. Fabrication of the ceramic package via implementation of the method and/or execution of the program product within a fabrication system further yields low metal loading and consequently lower cost for manufacturing the resulting ceramic packages/modules. Finally, the resulting ceramic packages/modules exhibit low far end (FE) noise/crosstalk relative to standard designs.

The illustrative embodiments provide an improved multi-layered ceramic package, which comprises: a signal layer with high power usage (HPU) areas (i.e., identified chip/device areas that require a supply of power) and one or more non-HPU areas; a voltage power (Vdd) layer disposed on a first side and a ground (Gnd) layer disposed on the opposite side, both directly adjacent to the signal layer and providing a first reference mesh plane and a second reference mesh plane that are configured according to a hybrid mesh scheme. The hybrid mesh scheme comprises two or more mesh densities within the single Vdd layer and Gnd layer from among: a full dense mesh in a first area of the Vdd layer and Gnd layer that is directly adjacent to the one or more HPU area in the signal layer; a half dense mesh in a second area of the Vdd layer and Gnd layer that is adjacent to one or more perimeter edges of and proximate to the HPU area in the signal layer; and a low density mesh in all other areas of the Vdd layer and Gnd layer that are not adjacent or proximate to the HPU area within the signal layer. The low density mesh provides a wider mesh pitch in the other areas, and the Vdd traces and Gnd are aligned to run parallel to adjacent signal lines in those other areas. Wider Vdd and Gnd traces are provided within the mesh scheme for traces that run parallel to the adjacent signal lines in the other areas.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

Within the descriptions of the figures, similar elements are provided similar names and reference numerals as those of the previous figure(s). Where a later figure utilizes the element in a different context or with different functionality, the element is provided a different leading numeral representative of the figure number. The specific numerals assigned to the elements are provided solely to aid in the description and not meant to imply any limitations (structural or functional or otherwise) on the described embodiment.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized.

With reference now to the figures, and beginning with FIG. 1, there is depicted a block diagram representation of an example data processing system (DPS). DPS 100 may be utilized within the described embodiments related to the method, program product and system for designing the ceramic package having the functional characteristics desired, including substantially reduced far end (FE) noise coupling (i.e., reduced crosstalk). DPS 100 may be a computer, or any other type of electronic devices that may generally be considered a processing device. As illustrated, DPS 100 comprises at least one processor or central processing unit (CPU) 102 connected to system memory 106 via system interconnect/bus 104. Also connected to system bus 104 is input/output (I/O) controller 115, which provides connectivity and control for input devices, of which pointing device (or mouse) 116 and keyboard 117 are illustrated. I/O controller 115 also provides connectivity and control for output devices, of which display 118 is illustrated. Additionally, a multimedia drive 119 (e.g., compact disk read/write (CDRW) or digital video disk (DVD) drive) and USB (universal serial bus) port 120 are illustrated, coupled to I/O controller 115. Multimedia drive 119 and USB port 120 enable insertion of a removable storage device (e.g., optical disk or "thumb" drive) on which data/instructions/code may be stored and/or from which data/instructions/code may be retrieved. DPS 100 also comprises storage 122, within/from which data/instructions/code may also be stored/retrieved. DPS 100 is also illustrated with a network interface device (NID) 125, by which DPS 100 may connect to one or more remote servers 132 via one or more access/external networks 130, of which the Internet is provided as one example. Finally, DPS 100 is illustrated communicatively connected to fabrication facility/system 175, which generally represents the facility at which the ceramic package, which is designed using software code executing on DPS 100, is actually fabricated. Fabrication facility 175 is not necessarily coupled to DPS 100, and the design 113 generated by DPS 100 may be stored on a removable medium or transmitted via external network 130 to a separate, remote fabrication facility.

In addition to the above described hardware components of DPS 100, various ceramic package design features are completed/supported via software (or firmware) code or logic stored within memory 106 or other storage (e.g., storage 122) and executed by CPU 102. Thus, for example, illustrated within memory 106 are a number of software/firmware/logic components, including operating system (OS) 108 (e.g., Microsoft Windows®, a trademark of Microsoft Corp, or GNU®/Linux®, registered trademarks of the Free Software Foundation and The Linux Mark Institute), Very High Speed Integrated Circuits Hardware Description Language (VHDL)/Verilog application 112, simulator 111, trace configuration 114 and Hybrid Reference Layer Mesh Scheme (HRMS) utility 110. Also included in memory 106 is (electrical) design 113. In actual implementation, HRMS utility 110 may be combined with one or more other software modules, including VHDL/Verilog application 112, design 113 and trace configuration 114, to provide a single executable component, collectively providing the various functions of each individual software component when the corresponding combined code of the executable component is executed by the CPU 102. For simplicity, HRMS utility 110 is illustrated and described as a standalone or separate software/firmware component/module, which provides specific functions, as described below. As a standalone component/module, HRMS utility 110 may be acquired as an off-the-shelf or after-market enhancement to existing program applications, such as VHDL/Verilog application 112. In at least one implementation, HRMS utility 110 may be downloaded from a server or website (e.g., remote server 132), and installed on DPS 100 or executed from the server.

CPU 102 executes HRMS utility 110 as well as OS 108, which supports the user interface features of HRMS utility 110, such as generation of a graphical user interface (GUI), where GUI generation is supported/provided by HRMS utility 110. In one embodiment, HRMS utility 110 generates/ provides one or more GUIs to enable user interaction with, or manipulation of, functional features of HRMS utility 110.

Those of ordinary skill in the art will appreciate that the hardware components and/or basic configuration depicted in FIG. 1 (and the configurations depicted within other figures presented herein) may vary. The illustrative components within these figures (e.g., DPS 100) are not intended to be exhaustive, but rather are representative to highlight essential components that are utilized to implement one embodiment of the present invention. For example, other devices/components may be used in addition to or in place of the hardware depicted. The depicted example is not meant to imply architectural or other limitations with respect to the presently described embodiments and/or the general invention. The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

Certain of the functions supported and/or provided by HRMS utility/logic 110 are enabled as processing logic (or code) executing on DPS/CPU 102 and/or other device hardware, and the processing logic (HRMS logic) completes/triggers the implementation of those function(s). Among the software code/instructions/logic provided by HRMS utility 110, and which are specific to the described embodiments of the invention, are code/logic for: (a) identifying one or more high power usage (HPU) areas within the signal layer at which the one or more devices/chips that require power are to be fabricated/inserted; (b) providing a full dense mesh plane of traces within the Vdd layer and Gnd layer adjacent to (i.e., directly under or above) the one or more HPU areas identified within the signal layer to support power deliver to the device/chip on the signal layer; and (c) providing in other areas that are not one of the identified HPU areas and is not proximate to the HPU areas a low density mesh with reference traces that are parallel to adjacent signals lines running on the signal layer.

Other functional code/logic includes code/logic for: (d) coupling the parallel and adjacent Vdd and Gnd traces to respective Vdd and Gnd vias that surround the signal lines to close the return path, which reduces discontinuity on a return path and results in less far end (FE) crosstalk; (e) differentiating in a reference Vdd or Gnd plane/layer (i) a first area that is directly adjacent to the HPU areas of the signal layer from (ii) a second area that is proximate to a perimeter edge of the one or more HPU areas in the signal layer and (iii) a third area on the signal layer that is not the first area or second area and is not proximate to the one or more HPU areas; (e) increasing a width of the Vdd and GND traces parallel to the adjacent signal lines in the third area to; (f) increasing a pitch (i.e., mesh gap) between traces on the Vdd and Gnd layer that are in the third area to enable a substantial reduction in the far end crosstalk and better bus performance; and (g) optimizing a width of the signal lines and a dielectric material thickness to obtain a desired impedance of the signal lines.

Figure 7:
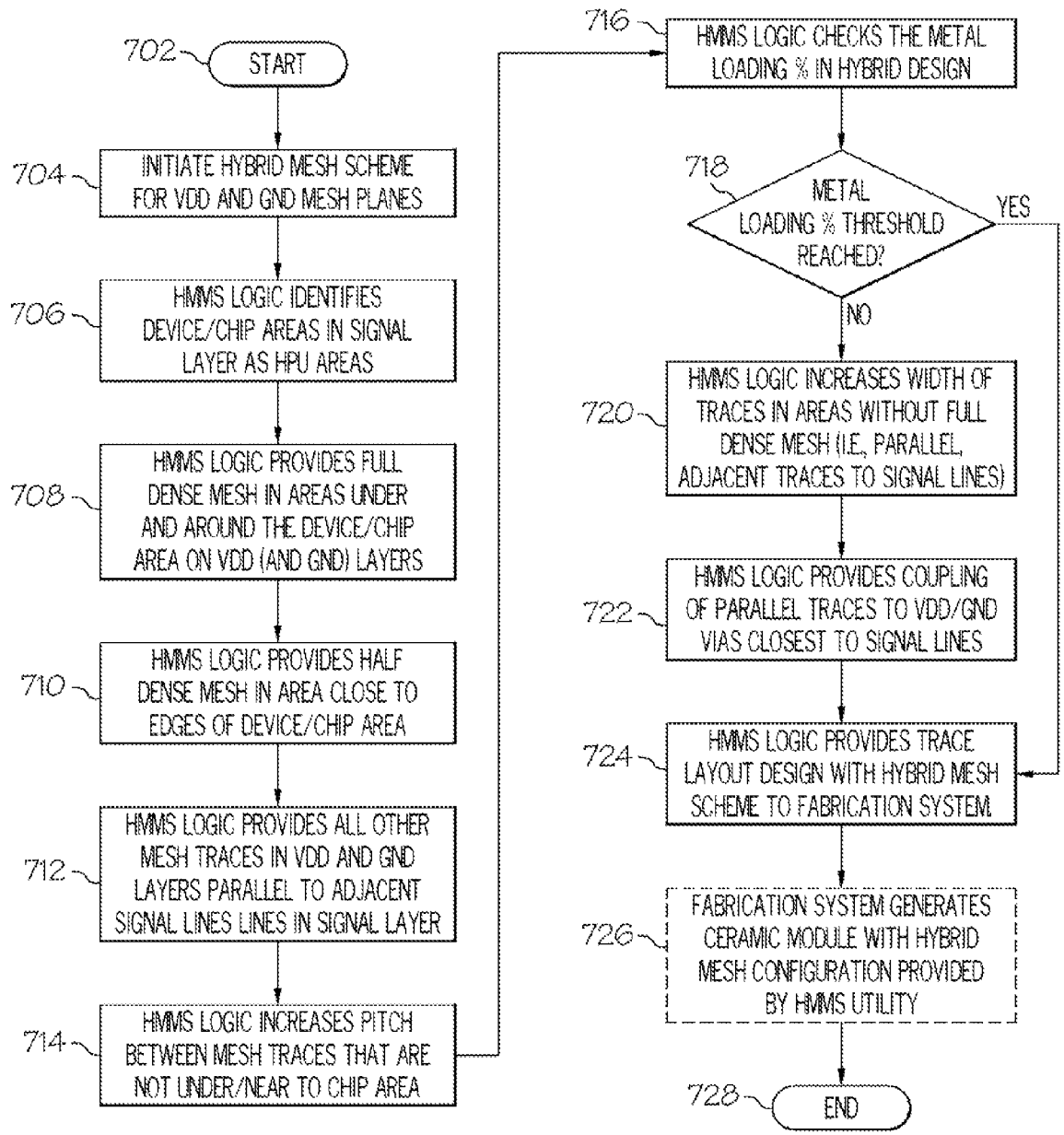
FIG. 7 is a flow chart illustrating the process of designing and fabricating a multi-layered ceramic module with a signal layer having one or more high power usage areas for devices/chips, and adjacent Vdd reference mesh plane and a Gnd reference mesh plane configured using a hybrid mesh scheme, according to one embodiment.

According to the illustrative embodiments, during design/manufacture of the multi-layered ceramic package, CPU 102 executes HRMS utility 110, thus enabling CPU 102/DPS 100 (or HRMS logic) to initiates/perform a series of processes that enable the above functional features as well as additional features/functionality (see FIG. 7, for example). These features/functionalities are described in greater detail below within the descriptions of FIGS. 2 and 4-7. Once HRMS utility 110 completes the functional processes of identifying the one or more areas having the one or more devices/chips within the signal layer and then determining the relative sizes/widths, pitch and placement of the Vdd, Gnd, and signal traces in the respective layers that make up the ceramic module, the particular design parameters are stored as design 113 and/or transmitted to fabrication facility/system 175 for fabrication of the improved ceramic package (see FIGS. 2, 4, 5 and 7).

The embodiments of the invention will be described primarily with a first configuration of ceramic modules that sandwiches a single signal layer between adjacent Vdd and Gnd layers. Examples of the extended cross sectional patterns of the ceramic module includes: (1) a cross section pattern represented as G1-R1-V1-R2-G2, which is used for signal redistribution; and a cross section representation of G1-X1-Y1-V1-X2-Y2-G2, which is called XY wiring. With these two example cross section patterns, the signal lines are on R or XY layers, respectively. The G and V layers are used for ground and power meshes. The invention applies to other configurations, as well, but is generally described herein with the first cross section pattern provided above. However, unlike with conventional mesh plane patterns, which comprise uniformly separated and configured Vdd mesh and Gnd mesh planes relative to the signal layer dispersed between the Vdd and Gnd layers, the embodiments described herein provide a hybrid mesh scheme within the Vdd and Gnd layers. This hybrid mesh scheme yields benefits such as low metal loading, reduced cost, reduced far end noise and other beneficial characteristics in the resulting ceramic modules.

Figure 2:
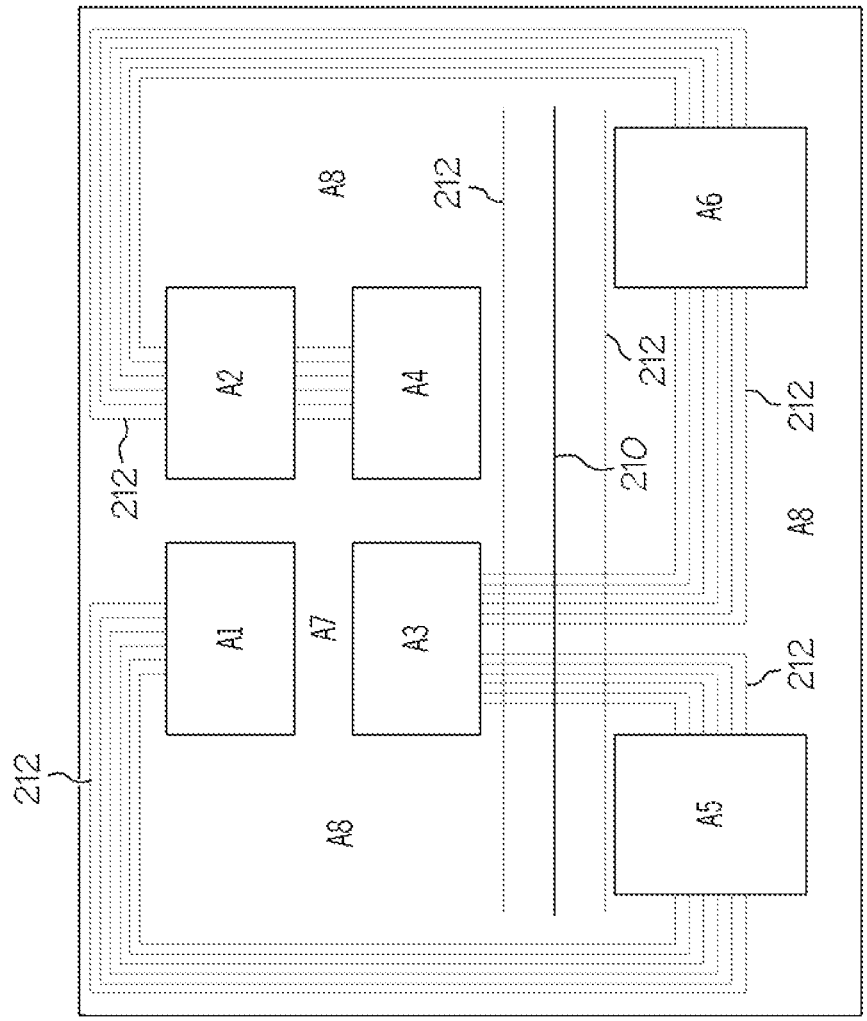
FIG. 2 illustrates a top (bird's eye) view of a signal layer within a multi-layered ceramic module of an integrated circuit (IC) with high power usage (HPU) areas for chips/devices identified with rectangular blocks, in accordance with one embodiment.
Figure 5:
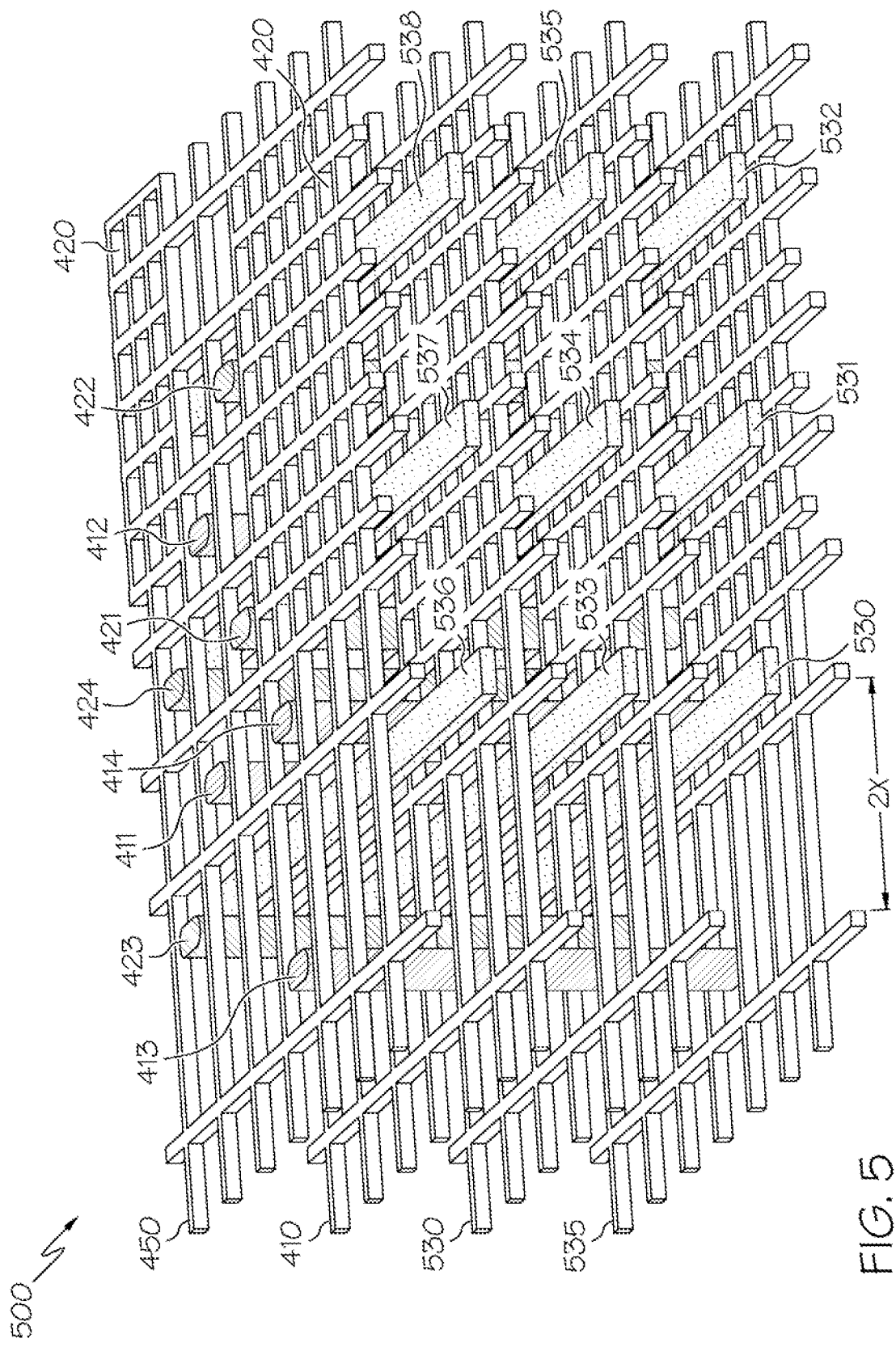
FIG. 5 illustrates a three dimensional view of an example multi-layered ceramic package/module designed with at least one signal layer sandwiched between two reference mesh layers that are configured with a hybrid mesh scheme relative to the signal nets within the signal layer, according to one embodiment.
Figure 6:
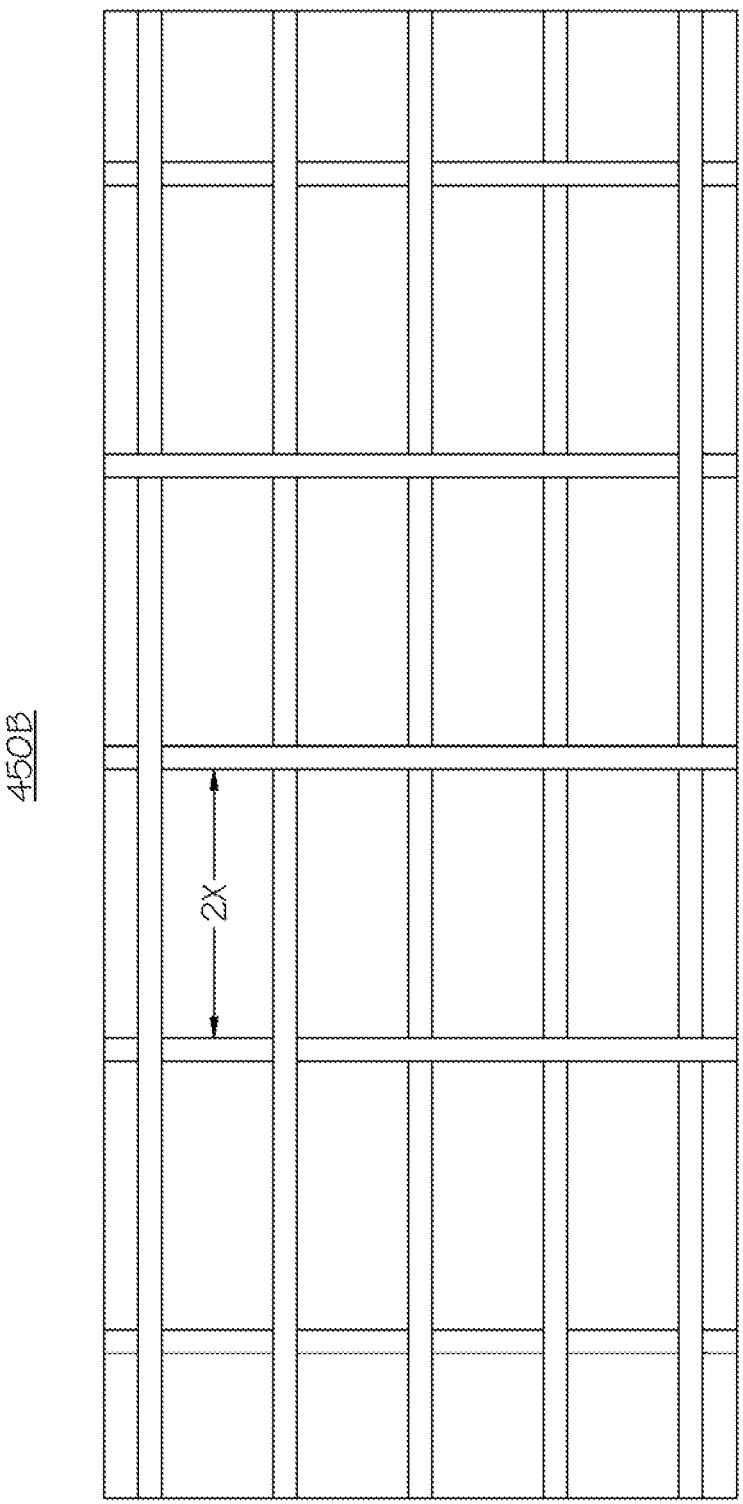
FIG. 6 is a top view of a mesh layer model that has a wider horizontal mesh pitch that is used in reference mesh layers adjacent to non-HPU areas of a ceramic module to enable the ceramic module to exhibit reduced far end noise, according to one embodiment.

Turning now to FIG. 2, there is illustrated a block diagram representation of an example signal layer/plane (an R layer of the G1-R1-V1-R2-G2 pattern), which represents one or several layers of a multi-layer ceramic package/module, such as the package/module illustrated as a three dimensional ceramic package in FIG. 5. Within the description of the various embodiments, the terms "layer" and "plane" (as in signal layer or signal plane or mesh layer or mesh plane) are utilized interchangeably to refer to a single one of the multiple layers within the multi-layer ceramic package. Also, while described as if the planes/layers are oriented a horizontal direction, with vertical separation that is substantially parallel to each other, it is understood that this configuration is provided solely to simplify the description of the ceramic module and that other orientations of the planes relative to each other (e.g., planes extending vertically, with horizontal separations) are also possible and supported. Thus, with the horizontally running orientation of planes/layers, each plane is described as being above or below a next vertically adjacent plane/layer, or simply "adjacent" to a next closest plane/layer. For example, the Gnd and Vdd planes are described as respectively "adjacent" to the signal plane, as both are disposed on opposite sides of (e.g., above and below) the signal plane. Similarly, Vdd traces and Gnd traces are considered adjacent to the signal trace when located above or below the signal trace or, in some instances, closest to the signal trace.

Returning to FIG. 2, signal layer 200 comprises a plurality of high power usage (HPU) areas, identified as rectangular blocks and marked as areas A1-A6. For simplicity, the HPU areas are provided with reference numerals enumerating the different locations within signal layer 200. These high power usage areas A1-A6 may correspond to the location of devices/chips (e.g., chip sites/areas) in the signal layer. The actual number of devices as well as the shapes and sizes, relative placement and specific functionality provided by each of these devices may vary from one design to another of the ceramic module. Signal layer also comprises other non-HPU areas, including perimeter area A7, which is the area at or proximate to the edge of one or more of the HPU areas, and general areas A8, which are areas that are not proximate to the HPU areas.

As shown, signal layers also comprises a large number of signal lines/traces/nets 212 interconnecting the various HPU areas (or devices disposed in those HPU areas) and connecting those device/chip sites with the traces from the other layers (not shown) from which power and ground connections for each respective device/chip is obtained. In one embodiment, a first set of signal traces represents memory nets, which belong to the VMEM voltage domain, while a second set of signal traces represent signal-ended elastic interface (EI) nets, which belong to the VIO domain. Additional traces include those for test/pervasive signals, with the remaining traces representing Vdd traces or Gnd traces. A substantial majority of the plurality of signal nets 212 are generally illustrated as standard width nets (as that terminology is defined) to contrast those signal nets 212 with wider nets, such as wider signal net 210. Thus, as further illustrated by the block diagram representation (see insert) of signal layer 200, at least one of these signal lines/nets 210 that runs in an area that is not proximate to the HPU areas (A1-A6 and A7) is provided a larger width than the other signal lines 212 that are proximate to the HPU areas.

With the above described signal layer 200 representing the R layer in a first cross section pattern, two adjacent layers are provided within the cremic package, the Vdd layer and Gnd layer, which respectively provide a Vdd reference mesh and Gnd reference mesh (or two Gnd reference meshes in other embodiments). The following descriptions are provided from an exploded cross sectional view/perspective of example ceramic packages with the Vdd layer and Gnd layer disposed below and above a signal layer to create three layers of the resulting multi-layered ceramic package. The signal layer is generally presented as a block diagram representation of the various HPU areas identified, specifically A1-A6, A7 and A8.

Figure 3:
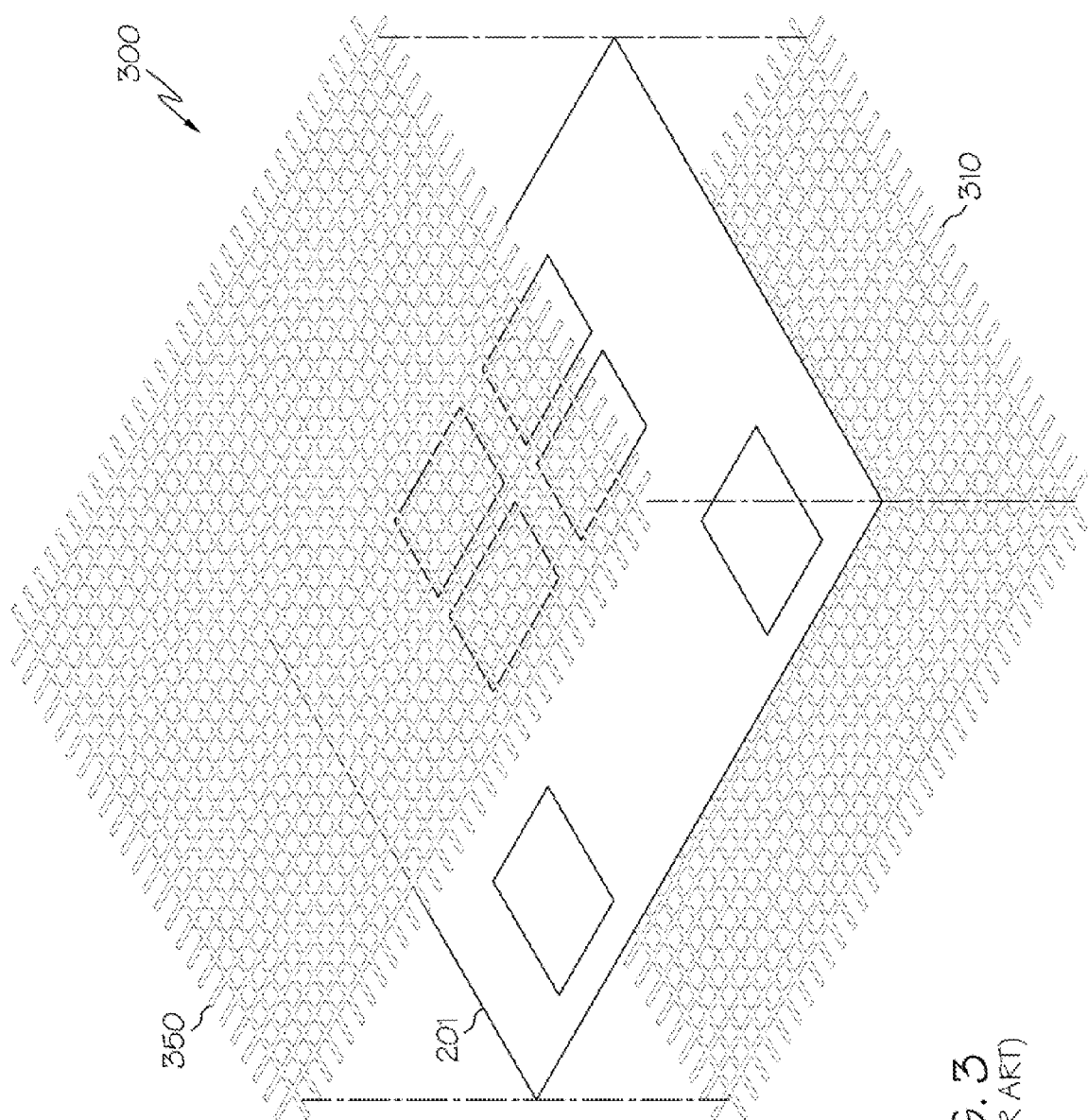
FIG. 3 illustrates an exploded cross sectional view of a ceramic package having the example signal layer of FIG. 2 sandwiched between a conventionally configured voltage power (Vdd) reference mesh layer and a conventionally configured ground (Gnd) reference mesh layer, according to the prior art.

FIG. 3 provides an exploded three dimensional view of the respective configuration of the reference mesh planes for the Vdd layer and Gnd layers adjacent to (i.e., below and above) a signal layer (201) for a conventional ceramic module 300. Signal layer 201 is similarly to signal layer 200 with respect to the layout of HPU areas; However, unlike signal layer 200 of FIG. 2, all signal lines/nets of signal layer 201 are a single uniform/standard width. In contrast, signal layer 200 may include different widths of signal nets based on relative locations f the signal lines to HPU areas, in accordance with the specific embodiment of ceramic module being manufactured under the hybrid mesh scheme of the present invention. Features related to the increase in the width of the signal nets away from HPU areas may, however, be applicable to ceramic modules that do not also implement a hybrid mesh scheme in the adjacent reference mesh layers. As shown by FIG. 3, the mesh traces 312 within the conventionally configured Vdd layer 310 are arranged with uniform periodicity, having a same density throughout the entire layer and a same pitch between each parallel trace. Also, each trace is of substantially equal width across the entire layer. The configuration of Vdd layer 310 provides an arrangement of a uniform mesh, which is configured independent of any consideration of the other layers of the ceramic module. This configuration provides for high metal loading in the Vdd layer. Likewise, FIG. 3 illustrates that the mesh traces within conventional Gnd layer 350 are similarly arranged with uniformity across the entire layer, with no consideration given to the other layers (such as the adjacent signal layer, which is visible below) of the overall ceramic module. At least two limitations are observed with these two conventional configurations of the Vdd layer and the Gnd layer. First, the metal loading on the Gnd and Vdd layers is too high, which translates to increased manufacturing difficulty and cost. Second, the detected far end (FE) crosstalk, and in some instances the near end (NE) crosstalk, is too high.

Figure 4:
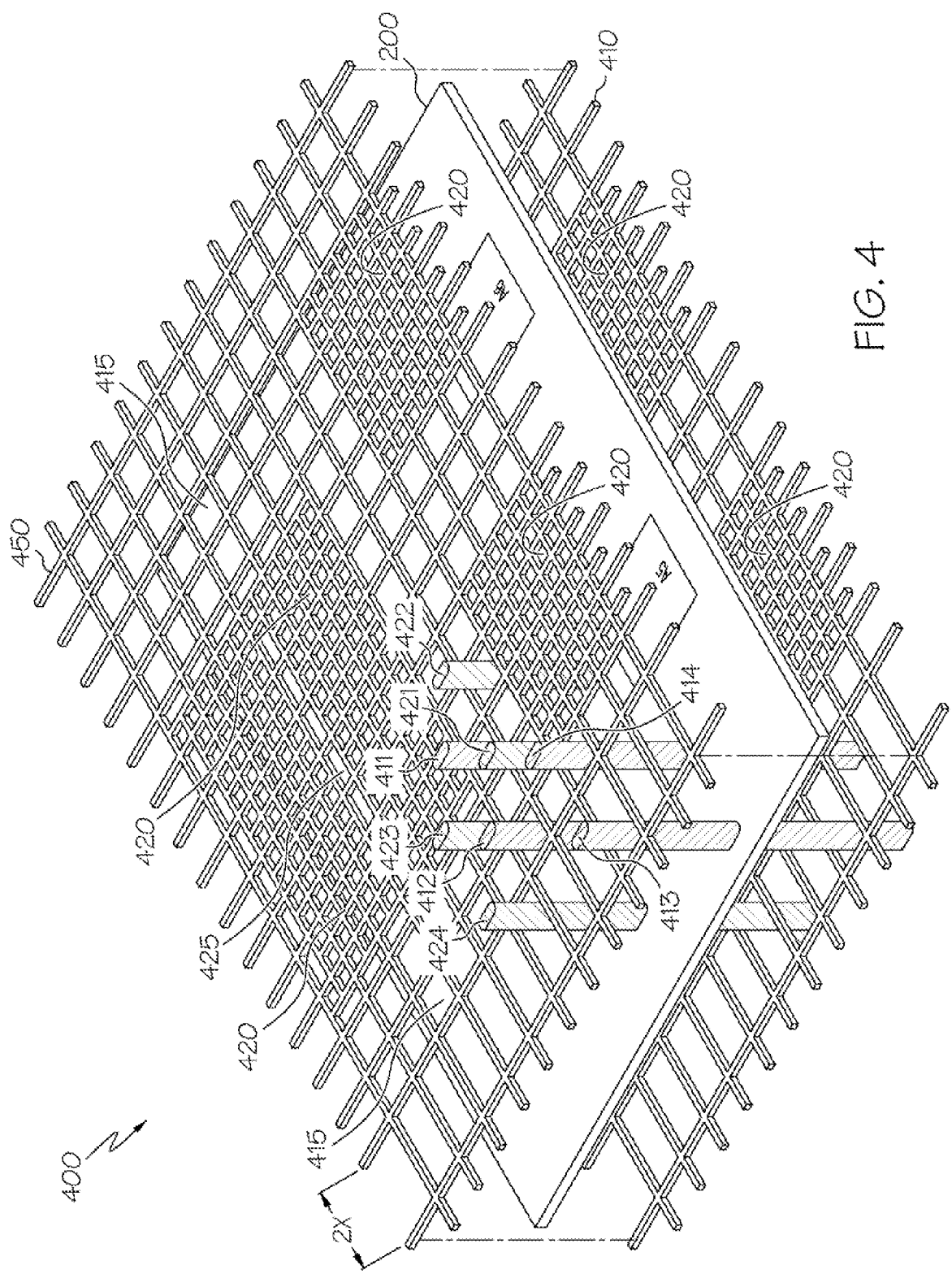
FIG. 4 illustrates an exploded cross sectional view of a ceramic package designed with the example signal layer of FIG. 2 sandwiched between an adjacent Vdd reference mesh layer and an adjacent Gnd reference mesh layer, with both Vdd and Gnd reference layers configured with a hybrid mesh scheme, according to one embodiment.

Turning now to FIG. 4, there is illustrated an exploded three dimensional view of three layers of an improved ceramic module 400 in which a hybrid mesh scheme is implemented, according to one embodiment. Specifically, FIG. 4 depicts hybrid mesh planes for a Vdd layer 410 and a Gnd layer 450 (or for two Gnd layers in some embodiments) located adjacent to (i.e., below and above) signal layer 200 of FIG. 2. This configuration of hybrid mesh layers may be repeated in additional layers adjacent to each signal layer, such as within example ceramic module 500 (FIG. 5). As shown by FIG. 4, the Vdd mesh plane (410) and Gnd mesh plane (450) are arranged according to the hybrid mesh scheme of the described embodiments. Only a front portion of Vdd mesh plane (410) is visible within the illustrated figure, however, it is appreciated and understood based on the descriptions herein that the other sections of Vdd mesh plane are similarly configured to the Gnd mesh plane depicted at the top of the three dimensional structure. It is further appreciated that the configuration of the reference planes adjacent to the signal layer 200 are not necessarily equivalent, as differences may exist in each layer based on other signal layers above and/or below as well as the underlying requirement that the final structure comply with the parameters established for metal loading, and noise coupling tolerance, among other factors.

The hybrid mesh scheme provided in the illustrative embodiments involves an understanding of the structural layout of the adjacent signal layer that receives power via the reference mesh plane(s). The embodiments are designed for optimal power distribution of the overall ceramic module and involves an appreciation that a better configuration of a multi-layer ceramic module than the conventional uniform mesh configuration would require a full dense mesh plane only under HPU areas of the signal layer (such as chip sites/areas) in order to better provide power to the devices/chips placed at those sites/areas within the signal layer. Due to high resistivity of the copper/moly paste used for glass ceramic and 9211 modules, most of the power (current) delivered to a device/chip placed at these chip sites is delivered by the metal structures under and just around the chip area. Conversely, far away from the devices/chips areas, the vias and/or traces do not need to carry much current. Because of these functional characteristics of the signal layer, a large number of BSM pins are usually assigned under the chip sites for power delivery. Also, in some embodiments, Vdd/Gnd BSM pins are also located away from the chip sites to provide high frequency return paths. With these foundation understandings, the described embodiments provide a hybrid mesh scheme that takes the power requirements of the signal layers into consideration rather than provide a uniform/single-sized pitch and width throughout the entire Vdd and Gnd reference mesh layers.

FIG. 4 illustrates the resulting hybrid mesh scheme for the Vdd layer 410 and Gnd layer 450 located adjacent to signal layer 200, which has one or more HPU areas (and/or devices/chips that require power). Two of these HPU areas, A5 and A6, are visible in signal layer 200 below the higher density (or full dense) mesh 420 of Gnd layer 450. It should be noted that while the described and illustrated embodiments provide both a reference voltage layer and a reference ground layer adjacent to the signal layer 200, certain implementations are possible in which the signal layer 200 is sandwiched between two reference ground layers. Thus, according to different embodiments, mesh planes above and below a signal layer 200 can provide Vdd and Gnd referencing as well as Gnd and Gnd referencing, depending on a given design of the ceramic module/package.

As illustrated by FIG. 4, Vdd layer 410 provides a configuration of different densities of mesh traces based on the location of the traces relative to the HPU areas (A1-A6) of the signal layer 200 at which the devices/chips requiring power are coupled (or areas in which the devices/chips are to be fabricated). As shown, for each first area of Vdd layer 410 located directly under (adjacent to) the identified HPU areas in the signal layer 200, a full dense mesh 420 is run under and around the HPU area (or device/chip site/area) for power deliver to the device/chip. Similarly, as also provided with FIG. 4, a full dense mesh 420 is also provided over and around the device/chip site/area within the Gnd layer 450. In one embodiment, a half dense mesh 425 is also provided at areas, such as A7, which are proximate to the perimeter edge of the HPU areas.

As further shown by FIG. 4, for all other areas 415 on the Vdd layer 410 and Gnd layer 450 that are not proximate to (i.e., not directly adjacent or near the perimeter edge of) the HPU areas (e.g., areas adjacent to A8 of the signal layer), the only Vdd and Gnd traces provided are those which run parallel to an adjacent signal on signal layer (200). This parallel running of adjacent Vdd and Gnd traces (relative to the signal lines on the signal layer 200) helps to reduce the discontinuity on the return path, which ultimate results in less FE crosstalk. In the illustrative embodiments, the parallel Vdd traces and Gnd traces are connected to respective Vdd vias 411, 412 and Gnd vias 421, 422 that surround the signal (on the signal layer) to close the return path. For simplification, only eight representative vias are shown within the illustration, of which two Vdd vias 411, 412 and two Gnd vias 421, 422 closest to the signal line 210 are referenced. The other vias 413, 414, 423, 424 are not necessarily connected.

According to one embodiment and as illustrated herein, the hybrid mesh scheme further provides a half dense mesh 415 in the orthogonal direction of signal line 210 (FIG. 2) rather than a full dense mesh, and parallel, adjacent trace referencing only. In one embodiment, the width of the Vdd and/or Gnd traces under the non-HPU areas are made wider than those that are located elsewhere within the Vdd and Gnd layers. Introduction of these wider traces in strategic locations enables a reduction in the IR drop on the traces (which is the primary source of the IR drop in a conventional substrate design). As the metal loading at the external areas of the chip sites (i.e., the non-HPU areas) is reduced, the amount of metal, i.e., the width of the Vdd and Gnd traces running parallel to the adjacent signal lines 210 are increased so that the noise coupling can be reduced. When a full dense mesh is used, as in the HPU areas, the metal limit does not allow for wider referencing Vdd and Gnd traces. Additionally, in one embodiment, the width of the signal lines (located away from the HPU areas) and dielectric material thickness are optimized so that the signal lines exhibit desired impedance. In one embodiment, matched impedance is provided on the driver side, which reduces any discernible increase in the near end noise. The above described hybrid mesh scheme therefore yields a number of benefits including: (a) good power delivery; (b) low metal loading, resulting in lower manufacturing cost; and (c) reduced FE crosstalk/noise.

Referring now to FIG. 5, there is illustrated a cross sectional view of example multi-layer ceramic module/package 500 with multiple layers identified, according to one illustrative embodiment. As illustrated by the cross sectional view of the three dimensional figure, within ceramic package 500 are multiple signal layers (including signal layer 200) sandwiched between hybrid Vdd mesh plane 410 and hybrid Gnd mesh plane 450. In actual implementation, ceramic module 500 may comprise multiple signal layers sandwiched between additional Vdd mesh layers and Gnd mesh layers, as illustrated by FIG. 5. Specifically, with FIG. 5, ceramic package 510 comprises four mesh layers/planes, generally represented as mesh planes 410, 460, 530, and 535, where at least the first two mesh planes are hybrid mesh planes similar to those of FIG. 4. Interspersed between these mesh planes are three signal (trace) layers, first, second and third signal layer, each separated from the other by a mesh plane. First signal layer 200 is assumed to be the signal layer of FIG. 2, with one or more HPU areas and other non-HPU areas. As provided by FIG. 5, however, only the signal lines at each signal layer are illustrated. For first signal layers (200), the signal traces/lines include S1 trace 530, S2 trace 531 and S3 trace 532. Second signal layer comprises S4 trace 533, S5 victim trace 534 and S6 trace 535. Third signal layer comprises S7 trace 536, S8 trace 537 and S9 trace 538. These signal traces are coupled to respective Vdd vias and Gnd vias of which Gnd vias 411-414 and Vdd vias 421-424 are illustrated.

With the above described hybrid mesh scheme, slight modifications are observed in the near end (NE) crosstalk, while measurable improvements are recorded with far end (FE) noise within the resulting ceramic package (500). In order to investigate the effect of mesh density on crosstalk, two ceramic package models were analyzed without any via, where the first model had a mesh pitch of 371.2 um and the second model 450B (illustrated by FIG. 6) has a mesh pitch of 742.4 um (or twice the horizontal mesh pitch of the first model). The models are presented to represent an arrangement of the traces within a Vdd reference mesh plane, such as Vdd mesh plane 410. With these examples, the pitch of the horizontal grid of the first model is 371.2 um and that of the vertical grid is 83 um. The pitch of the horizontal grid of the illustrated second model 600 is 742.4 um. The width of the signal line is 59 um and the width of the mesh line is 61 um for each model. Also, for these models, a P7 ground rule was used. Then, these models were run in PowerSPICE simulator to compare the noise coupling characteristics. In SPICE decks, a one volt (1 V) ramp source with 75 pico-second (psec) rise time is applied to inputs of signal lines S1, S2, S3, S4, S6, S7, S8, and S9 (reference figure numbers 530-533, 535-538). For the simulation, the signal net S5 (see FIG. 5) is chosen as a victim net. The inputs and outputs of these signal lines are terminated with 50 ohm resistors.

Table I below illustrates a noise coupling comparison for the two different mesh configurations with the second model representing the hybrid mesh scheme with an increased pitch between Vdd traces, according to one embodiment.

TABLE I

| Configuration | Maximum NE (near end) noise [mV] | Maximum absolute FE (far end) noise [mV] |
|---|---|---|
| Trace model with 371.2 um mesh pitch structure | 29.2 | 59.6 |
| Trace model with 742.4 um mesh pitch | 31.7 | 38.2 |

Table I comprises three columns: (a) configuration column, Maximum NE (near end) noise column and Maximum absolute FE (far end) noise column. Table I provides coupling noise results for two distinct configurations shown via the rows of the table. First configuration row provides results for a configuration which uses a mesh pitch of 371.5 micrometer, while the second configuration row provides results for a configuration which employs the a mesh pitch of 742.4 micrometer (double that of the first configuration). The above configurations are computer generated and then executed in a Power SPICE simulator to provide a noise coupling comparison.

Table I shows near end (NE) coupling noise effects on S5 victim signal net 534 due to all 8 aggressor nets (530-533, 535-538) for the configuration with the first and second mesh configurations. Table I shows that the maximum NE noise voltage is increased slightly by the increased pitch of the mesh. In addition, Table I shows far end (FE) coupling noise effects on S5 victim signal net 534 due to all aggressor nets for the structures with the first and second mesh configurations. In ceramic packages, FE noise is typically much greater than NE noise, and reduction in FE noise is therefore a desired goal during design and fabrication of ceramic packages. Table I shows that the maximum FE noise voltage is reduced significantly by the increase in mesh pitch, which is critical for system performance. Also, in one embodiment, using the same ground rule with less trace or without orthogonal trace on Vdd and Gnd layers causes less far end crosstalk.

Table I provides a comparison of the maximum absolute values of a first FE noise waveform and a second FE noise waveform shows that the maximum FE noise is reduced greatly (35.9% in the example provided) by doubling the pitch of the mesh. According to the results of the simulation, the inclusion of the matched impedance on the driver side offsets the small increase in near end noise, and there is no reflected near end crosstalk to DRVs. More significantly, the far end crosstalk is smaller, and the bus performance is better. Thus, the disclosed embodiments generally provide for a modification of Vdd and Gnd meshes in ceramic modules in non-critical areas to improve far-end noise performance in the module. Implementation of the described embodiments improves the far-end noise performance of the module, and the module costs are also reduced due to reduction in the amount of materials used.

FIG. 7 is a flow chart illustrating the method by which the above processes of the illustrative embodiments are completed. In particular, FIG. 7 illustrates the process of designing a ceramic package with a hybrid mesh scheme used for both the Vdd and Gnd reference mesh layers, according to the methodology described by the embodiments. Although the method illustrated in FIG. 7 may be described with reference to components shown in FIG. 1 and FIGS. 2, 4-5, it should be understood that this is merely for convenience and alternative components and/or configurations thereof can be employed when implementing the method. Key portions of the method may be completed by HRMS utility 110 executing on a processor (e.g., CPU 102 within DPS 100 (FIG. 1) and controlling specific operations of/on DPS 100. The method is thus described from the perspective of either/both HRMS utility 110 and DPS 100.

In the flow chart described below, certain processes of the methods are combined, performed simultaneously or in a different order, or perhaps omitted, without deviating from the spirit and scope of the invention. Thus, while the method processes are described and illustrated in a particular sequence, use of a specific sequence of processes is not meant to imply any limitations on the invention. Changes may be made with regards to the sequence of processes without departing from the spirit or scope of the present invention. Use of a particular sequence is therefore, not to be taken in a limiting sense, and the scope of the present invention extends to the appended claims and equivalents thereof.

The process of FIG. 7 begins at initiator block 702 and proceeds to block 704, at which processor-executed logic of HRMS utility 110 (or HRMS logic) initiates the hybrid mesh scheme for Vdd and Gnd mesh planes. With the hybrid mesh scheme initiated, HRMS logic performs the function of identifying one or more HPU areas within the signal layer at which the one or more devices/chips that require power are to be situated/fabricated, as shown at block 706. The one or more HPU areas are also referred to herein as chip/device areas. In one expanded embodiment, identifying the one or more areas comprises differentiating, in a reference Vdd or Gnd plane/layer, (a) a first area that is directly adjacent to (i.e., under and above) the one or more HPU areas of the signal layer from (b) a second area that is proximate to a perimeter edge of the one or more devices/chips in the signal layer and (c) a third area adjacent to those other areas on the signal layer that is away from the first and second area (i.e., not proximate to the one or more HPU areas). Then the application of the hybrid mesh scheme is performed as several functional processes corresponding to the three different areas identified in the Vdd and Gnd mesh layers.

At block 708, the HRMS logic performs the function of providing a full dense mesh within the Vdd layer (and Gnd layer) adjacent to the one or more HPU areas identified within the signal layer to support power delivery to the devices/chips on the signal layer. At block 710, the HRMS logic performs the function of providing a half dense mesh within the Vdd layer (and Gnd layer) proximate to the perimeter edge of the adjacent one or more HPU areas. The HRMS logic performs the function of providing in every other area that is not adjacent to one of the identified HPU areas and is therefore located away from the one or more devices/chips, only traces that are parallel to adjacent signal lines running on the signal layer, as shown at block 712.

The HRMS logic also provides the design function of increasing a pitch between traces on the Vdd and Gnd layers that are not directly adjacent or proximate to the one or more HPU areas, according to block 714. The increasing of the pitch provides a substantial reduction in the far end crosstalk in the resulting ceramic module and enables better bus performance. At block 716, the HRMS logic also checks the metal loading percentage in the hybrid design, and determines, at block 718, whether a metal loading threshold percentage has been reached. When the metal loading threshold has not been reached, the HRMS logic performs the function of increasing a width of the Vdd and GND traces running parallel to the adjacent signal lines in the non-HPU areas to a larger width, as provided at block 720.

Following the allocation of the hybrid mesh scheme, the HRMS logic also provides the function of coupling the parallel and adjacent Vdd and Gnd traces to respective Vdd and Gnd vias that surround the signal lines to close the return path, as shown at block 722. This step is provided to reduce discontinuity on a return path and results in less far end (FE) crosstalk. At block 724, HRMS logic provides/forwards the trace layout design of the ceramic package configured with the hybrid mesh scheme to a fabrication system. The fabrication system then generates/fabricates the enhanced ceramic package with the hybrid mesh scheme based on the layout/design generated by the HRMS utility, as shown at block 726. The process ends at block 728.

As will be appreciated by one skilled in the art, the software aspects of the present invention may be embodied as a method and/or logic within a computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," "logic," or "system." Furthermore, the present invention may take the form of a computer program product on a computer-usable storage medium having computer-usable program code embodied in or on the medium.

As will be further appreciated, the processes in embodiments of the present invention may be implemented using any combination of software, firmware, microcode, or hardware. As a preparatory step to practicing the invention in software, the programming code (whether software or firmware) will typically be stored in one or more machine readable storage mediums such as fixed (hard) drives, diskettes, magnetic disks, optical disks, magnetic tape, semiconductor memories such as RAMs, ROMs, PROMs, etc., thereby making an article of manufacture in accordance with the invention. The article of manufacture containing the programming code is used by either executing the code directly from the storage device, by copying the code from the storage device into another storage device such as memory 106 of DPS 100 (FIG. 1) or a hard disk, etc., or by transmitting the code for remote execution using transmission type media such as digital and analog communication links. The medium may be electronic, magnetic, optical, electromagnetic, infrared, or semiconductor system (or apparatus or device) or a propagation medium. Further, the medium may be any apparatus that may contain, store, communicate, propagate, or transport the program for use by or in connection with the execution system, apparatus, or device. The methods of the invention may be practiced by combining one or more machine-readable storage devices containing the code according to the described embodiment(s) with appropriate processing hardware to execute the code contained therein. An apparatus for practicing the invention could be one or more processing devices and storage systems containing or having network access (via servers) to program(s) coded in accordance with the invention. In general, the term computer, computer system, or data processing system can be broadly defined to encompass any device having a processor (or processing unit) which executes instructions/code from a memory medium.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. In a fabrication system for a multi-layer ceramic module having at least one signal layer with one or more devices/chips that require power, a method for providing adequate power to the one or more devices/chips while reducing the amount of metal utilized within the module and reducing far end (FE) noise within the module, the method comprising:
    identifying one or more high power usage (HPU) areas within the signal layer at which the one or more devices/chips that require power are to be situated;
    providing a full dense mesh plane of traces within first areas of a voltage power (Vdd) layer and a ground (Gnd) layer that are adjacent to the HPU areas within the signal layer to support power deliver to the devices/chips on the signal layer; and
    providing a low density mesh plane of traces in other areas of the Vdd layer and Gnd layer that are not adjacent to or proximate to the HPU areas within the signal layer.

2. The method of claim 1, wherein the providing a low density mesh plane further comprises providing only Vdd traces and Gnd traces that are parallel to adjacent signals lines running on the signal layer.

3. The method of claim 1, wherein:
    identifying the one or more HPU areas comprises differentiating in a Vdd reference plane and in a Gnd reference plane (a) a first HPU area that is directly adjacent to the one or more HPU areas of the signal layer from (b) a second area that is proximate to a perimeter edge of the one or more HPU areas of the signal layer and (c) a third area on the signal layer that is away from the first area and the second area and not proximate to the one or more HPU areas; and
    said method further comprises providing a half dense mesh of traces within second areas of the Vdd layer and Gnd layer that are adjacent to and proximate to the perimeter edge of the HPU areas.

4. The method of claim 1, further comprising:
    providing a larger width of the Vdd and Gnd traces running parallel to and adjacent to signal lines in the other areas that are not proximate to the one or more HPU areas, wherein the larger width provides wider Vdd and Gnd traces, which reduce the IR drop on the respective traces.

5. The method of claim 4, further comprising providing a matched impedance at a driver side of one or more signal lines to reduce near end (NE) crosstalk.

6. The method of claim 1, further comprising:
    reducing an amount of metal loading at areas within the Gnd and Vdd layers that are not adjacent to or proximate to the HPU areas by increasing a mesh pitch between traces on the Vdd layer and Gnd layer in areas that are not directly adjacent to or proximate to the one or more HPU areas, wherein the increasing of the mesh pitch provides a substantial reduction in the far end crosstalk and better bus performance.

7. The method of claim 1, further comprising:
    optimizing a width of the signal lines and a dielectric material thickness to obtain a desired impedance of the signal lines; and
    increasing the width of the Vdd and Gnd reference traces that are above, below, and adjacent to the signals lines to reduce noise coupling.

8. The method of claim 1, further comprising:
    disposing a plurality of vias in spaces provided by the Vdd mesh plane and Gnd mesh plane with each via of the plurality of vias providing one of a Vdd connection or a Gnd connection;
    coupling to surrounding Vdd vias and Gnd vias the signal lines that are not proximate to the HPU areas to close the return path; and
    running parallel Vdd traces and Gnd traces that are adjacent to the signal lines, wherein providing the parallel, adjacent Vdd and Gnd traces reduces discontinuity on a return path and results in less far end (FE) crosstalk.

9. A computer program product for use in fabrication and design of high speed ceramic packages comprising:
    a computer readable medium; and
    program code on said computer readable medium that when executed within a data processing device, said program code provides the functionality of:

identifying one or more high power usage (HPU) areas within the signal layer at which the one or more devices/chips that require power are to be situated;

providing a full dense mesh plane of traces within first areas of a voltage power (Vdd) layer and a ground (Gnd) layer that are adjacent to the HPU areas within the signal layer to support power deliver to the devices/chips on the signal layer; and providing a low density mesh plane of traces in other areas of the Vdd layer and Gnd layer that are not adjacent to or proximate to the HPU areas within the signal layer.

10. The computer program product of claim 9, wherein:

said program code for identifying the one or more areas further comprises code for differentiating in a Vdd reference plane and in a Gnd reference plane (a) a first HPU area that is directly adjacent to the one or more HPU areas of the signal layer from (b) a second area that is proximate to a perimeter edge of the one or more HPU areas of the signal layer and (c) a third area on the signal layer that is away from the first area and the second area and not proximate to the one or more HPU areas; and said program code further comprises code completing the functionality of providing a half dense mesh of traces within second areas of the Vdd layer and Gnd layer that are adjacent to and proximate to the perimeter edge of the HPU areas.

11. The computer program product of claim 9, said program code further comprising code for completing the functionality of:

reducing an amount of metal loading at areas within the Gnd and Vdd layers that are not adjacent to or proximate to the HPU areas by increasing a mesh pitch between traces on the Vdd layer and Gnd layer in areas that are not directly adjacent to or proximate to the one or more HPU areas, wherein the increasing of the mesh pitch provides a substantial reduction in the far end crosstalk and better bus performance.

12. The computer program product of claim 9, said program code further comprising code for:

optimizing a width of the signal lines and a dielectric material thickness to obtain a desired impedance of the signal lines;

reducing an amount of metal loading at areas within the Gnd and Vdd layers that are not above or below the device/chip in the signal layer, by reducing a width of the Vdd and Gnd traces to a second width; and increasing the width of the Vdd and Gnd reference traces that are above, below, and adjacent to the signals lines to reduce noise coupling.

13. The computer program product of claim 9, said program code further comprising code for:

optimizing a width of the signal lines and a dielectric material thickness to obtain a desired impedance of the signal lines; and increasing the width of the Vdd and Gnd reference traces that are above, below, and adjacent to the signals lines to reduce noise coupling.

14. The computer program product of claim 9, wherein the program code for providing a low density mesh plane further comprises:

providing only Vdd traces and Gnd traces that are parallel to adjacent signals lines running on the signal layer; and providing a larger width of the Vdd and Gnd traces running parallel to and adjacent to signal lines in the other areas that are not proximate to the one or more HPU areas, wherein the larger width provides wider Vdd and Gnd traces, which reduce the IR drop on the respective traces.

15. The computer program product of claim 14, said program code further comprising code for providing a matched impedance at a driver side of one or more signal lines to reduce near end (NE) crosstalk.

* * * * *